United States Patent
Di Sena et al.

(10) Patent No.: US 7,363,421 B2
(45) Date of Patent: Apr. 22, 2008

(54) OPTIMIZING WRITE/ERASE OPERATIONS IN MEMORY DEVICES

(75) Inventors: Angelo Di Sena, Castello Di Cisterna (IT); Agata Intini, Putignano (IT)

(73) Assignee: STMicroelectronics S.r.l., Agrate Brianza (IT)

(*) Notice: Subject to any disclaimer, the term of this patent is extended or adjusted under 35 U.S.C. 154(b) by 234 days.

(21) Appl. No.: 11/035,013

(22) Filed: Jan. 13, 2005

(65) Prior Publication Data

US 2006/0155917 A1  Jul. 13, 2006

(51) Int. Cl.
*G06F 12/00*  (2006.01)
*G06F 13/00*  (2006.01)

(52) U.S. Cl. .................. 711/103; 711/100; 711/154

(58) Field of Classification Search ............. 711/103, 711/100, 104, 105, 154, 156; 365/185.29
See application file for complete search history.

(56) References Cited

U.S. PATENT DOCUMENTS

| | | | |
|---|---|---|---|
| 5,568,423 A * | 10/1996 | Jou et al. ............... 365/185.33 |
| 6,000,006 A * | 12/1999 | Bruce et al. ................ 711/103 |
| 6,081,447 A * | 6/2000 | Lofgren et al. ......... 365/185.02 |
| 6,092,160 A * | 7/2000 | Marsters ..................... 711/156 |
| 6,426,893 B1 * | 7/2002 | Conley et al. .......... 365/185.11 |
| 6,621,746 B1 * | 9/2003 | Aasheim et al. ........ 365/185.29 |
| 6,925,012 B2 * | 8/2005 | Yamagami et al. .... 365/185.33 |
| 7,093,161 B1 * | 8/2006 | Mambakkam et al. ........ 714/15 |
| 2003/0225961 A1 * | 12/2003 | Chow et al. ................. 711/103 |
| 2004/0088474 A1 * | 5/2004 | Lin ............................ 711/103 |
| 2004/0177212 A1 * | 9/2004 | Chang et al. ............... 711/103 |
| 2005/0071403 A1 * | 3/2005 | Taunton ....................... 708/404 |

* cited by examiner

*Primary Examiner*—Tuan V. Thai
(74) *Attorney, Agent, or Firm*—Lisa K. Jorgenson; Timothy L. Boller; Seed IP Law Group PLLC

(57) ABSTRACT

A method controls write/erase operations in a memory device including memory blocks that are exposed to wear as a result of repeated erasures. The method includes: storing the erase counts of the memory blocks, creating a chain storing the erase counts of the memory blocks that are available for writing at a certain instant of time, and selecting for writing, out of the blocks in the memory device available for writing, the block having the lowest erase count in the chain.

31 Claims, 7 Drawing Sheets

US 7,363,421 B2

OPTIMIZING WRITE/ERASE OPERATIONS IN MEMORY DEVICES

BACKGROUND OF THE INVENTION

1. Field of the Invention

The invention relates to techniques for optimizing write/erase operations in memory/storage devices, and was developed by paying specific attention to the possible application in "flash" memories.

2. Description of the Related Art

Flash memories are non-volatile storage devices, able to store recorded data without a power source. A computer program using the ability of a flash memory to be erased and reprogrammed can modify the data stored in a flash memory. These basic capabilities have made flash memories suitable for acting as standard storage media in computer systems, i.e. as flash disks.

Flash devices are typically partitioned in several contiguous zones, each of which is individually erasable. Such zones are known under various designations, such as units or blocks. For the sake of clarity, in the following description they will be referred to as blocks or erase units.

A limitation of flash memory technology lies in that the number of times a block can be erased is intrinsically limited by the physics of the flash cell. Repeated erasure of a block wears out the cells in the unit leading to a reduced capability to distinguish between the erased state and the programmed state. This results in a longer time being required to erase the unit, and to the appearance of sporadic faults in programming or erasing data. The unit may ultimately entirely lose its ability of being erased and reprogrammed.

The effects of wear are statistical in nature, and the ability of a flash device to withstand wear is usually described in terms of a number called the program/erase endurance. This number is the minimum or average number of times each flash unit can be erased without encountering significant failures. Vendor endurance numbers currently range from tens of thousands to a million.

The limited endurance limits the lifetime of a flash disk. It would be advantageous to have a lifetime that is as long as possible, and this depends on the pattern of access to the flash disk. Repeated and frequent writes to a single block or a small number of blocks will end the useful lifetime of the media quickly. On the other hand, if writes can be evenly distributed to all blocks of the media, each block will be capable of coming close to the maximum number of erases it can endure. The onset of failures will thus be delayed as much as possible, maximizing the lifetime of the media.

Flash disk managers typically employ algorithms that give them discretion over the physical location where new data will be written, and they direct written data in such a way to guarantee that different flash units will be subjected to the same number of erases. Such a procedure is known in the art as "wear leveling". Some managers record the number of erases a unit has experienced in a register in that unit, and enforce a procedure intended to guarantee that the variation in the number of erases of each unit will not exceed some small constant. Other arrangements use a randomization of the choice of the target unit, and rely on statistics and the law of large numbers to maintain an even wear across the flash media.

BRIEF SUMMARY OF THE INVENTION

While such prior art arrangements are capable of providing satisfactory results, the need is felt for improved solutions adapted to ensure a uniform use of each block in a flash memory. One embodiment of the present invention provides a fully satisfactory response to this need.

One embodiment of the invention is directed to a method of controlling write/erase operations in a memory device including memory blocks that are exposed to wear as a result of repeated erasures. The method includes: storing erase counts of the memory blocks; creating a chain storing the erase counts of the memory blocks that are available for writing at a certain instant of time; and selecting for writing, out of the blocks of the memory device available for writing, the block having the lowest erase count in the chain.

BRIEF DESCRIPTION OF THE ANNEXED DRAWING

The invention will now be described, by way of example only, with reference to the enclosed drawings.

DETAILED DESCRIPTION OF THE INVENTION

The solution described herein is essentially a technique for improving "wear leveling" of static areas in a flash memory, by ensuring a uniform use of each block in a flash memory device. This technique maintains the erase count of each block in a table and selects the block to write by choosing from the table the free block with the lowest erase count.

Typically, the method comprises the steps of:

storing in a table the erases count of each block in a flash memory, and creating a chain in a portion of a RAM memory (Random Access Memory) to store the erases count of the free blocks at a determined instant of time.

As used herein, the term "chain" refers to a set of elements that are linked to one another either explicitly or implicitly. That is, the links between elements can be explicit in that one element includes a pointer that points to the next element. Alternatively, the links between elements can be implicit in that the elements are located in predetermined positions with respect to one another such that the next element is accessed automatically from a current element, such as in a table in which the next element is positioned immediately after or before the current element.

The arrangement described herein ensures that when data are to be written in a free block, the block selected is the one that has been erased the minimum number of times.

Specifically, the arrangement described herein provides for the following steps:

storing the erases count of each block, named age, in a table, named Aging Block Table (ABT), memorized in the flash memory itself;

keeping in the RAM memory a chain of information items related to the free blocks present in the flash device; and choosing for writing purposes, from the chain in the RAM memory, the block with the minimum number of erases cycle.

Figure 1:
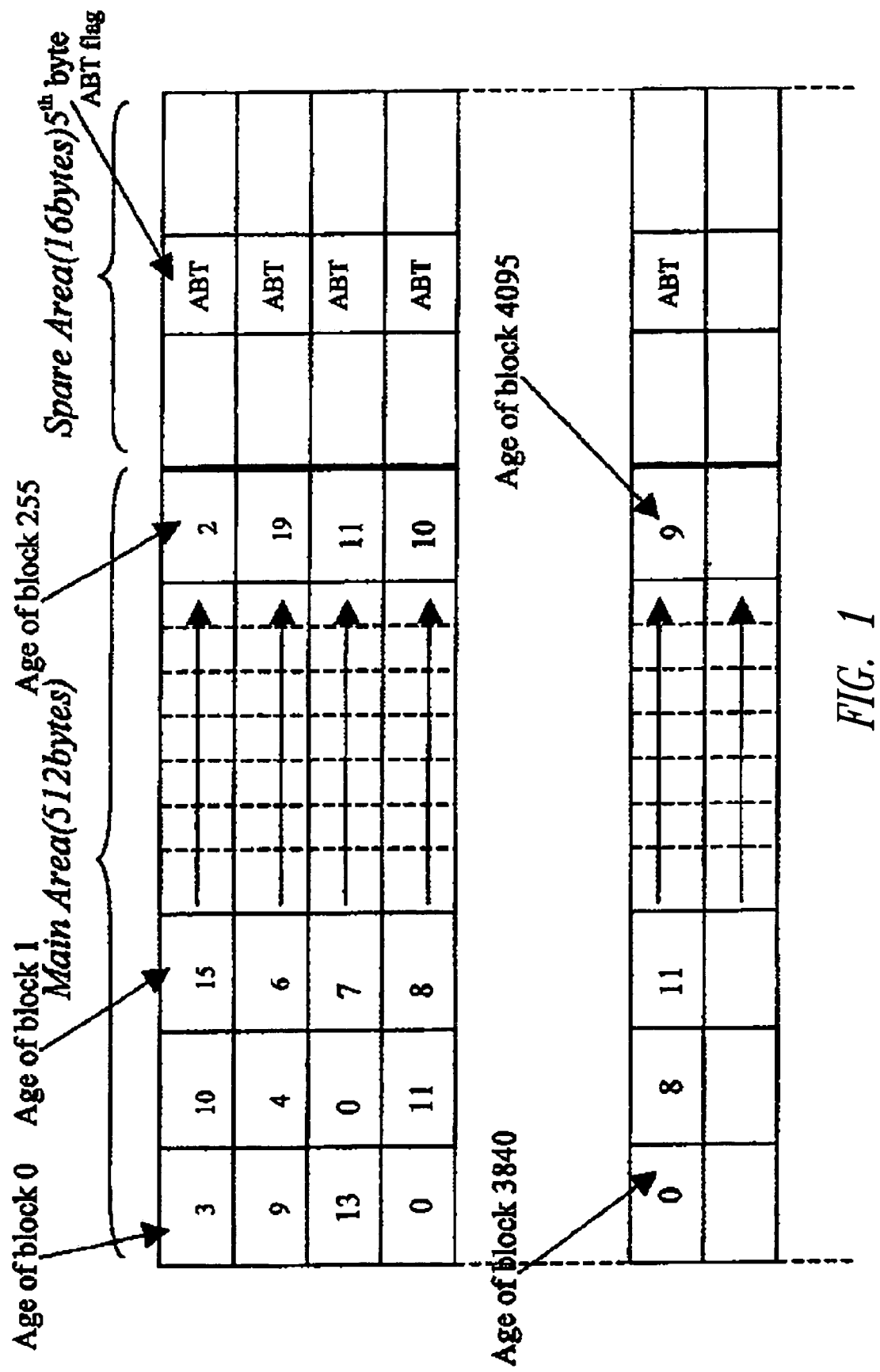
FIG. 1 shows an exemplary architecture of a flash memory that implements the arrangement described herein.

FIG. 1 shows a portion of a flash memory device that contains the Aging Block Table (ABT).

The i-th entry in the Aging Block Table represents the number of erase operations performed on the block of position—i—in the flash memory device. The number of erase operations for a given block is called the "age" of the block.

In the example shown in FIG. 1 the block is divided in a main area of 512 bytes and a spare area of 16 bytes.

The main area contains the entries of the Aging Block Table. The Aging Block Table contains an entry for each block in the flash memory device.

In particular, FIG. 1 shows an Aging Block Table for a flash device comprised of 4096 erasable blocks (each block is in turn comprised of 32 pages).

Each entry of the Aging Block Table is two bytes of size, so that each page contains 256 entries (1024 in devices with pages of 2048 bytes). Sixteen pages are used to store the Aging Block Table of the example shown in FIG. 1.

The pages used to store the Aging Block Table entries contain a flag, the Aging Block Table flag, in the fifth byte of the spare area.

Figure 2:
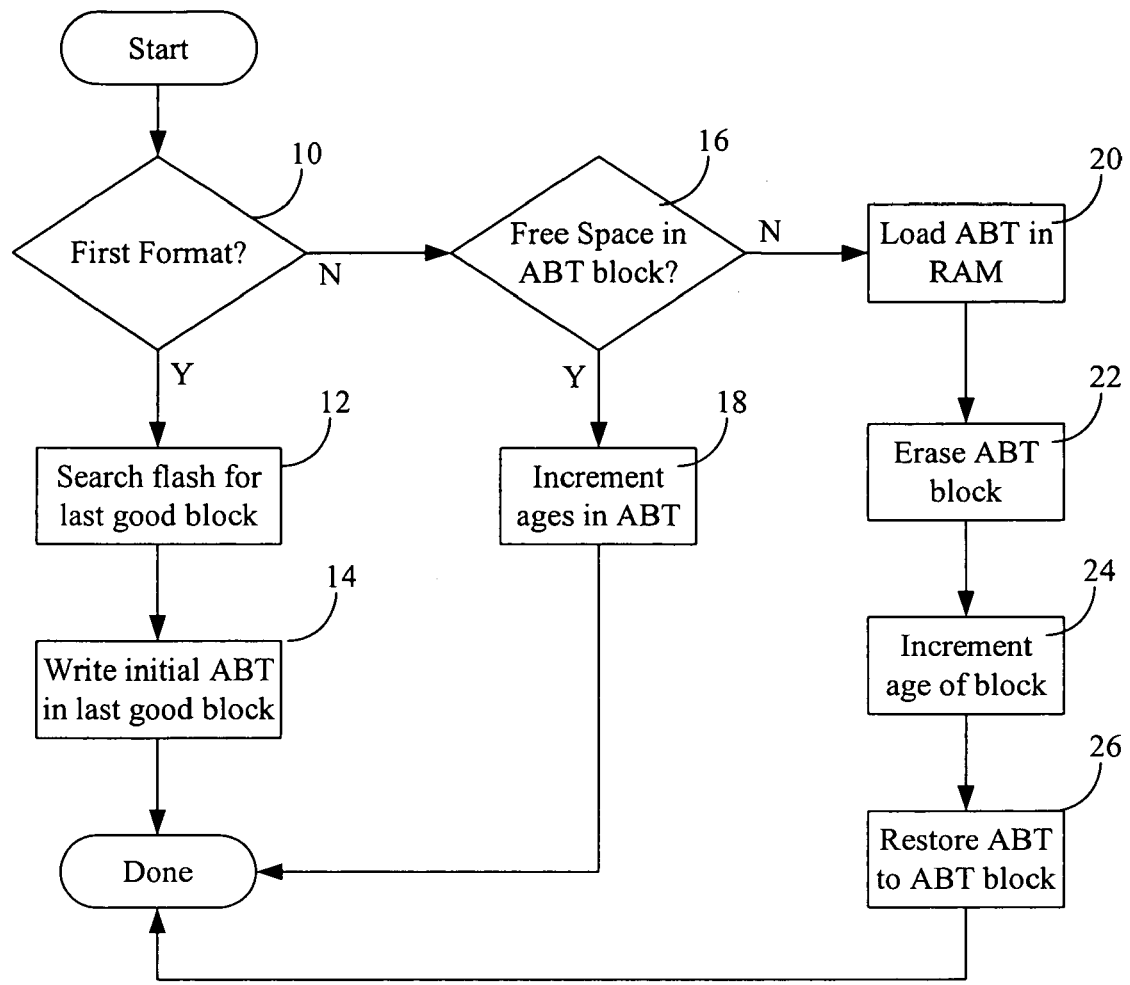
FIG. 2 is a flowchart of a procedure for implementing an aged block table (ABT) when formatting the flash memory.

Shown in FIG. 2 is a procedure for implementing the ABT when formatting the flash memory. First, in response to a format command, the procedure determines in step 10 whether it is the first format for the flash memory. If so, then the procedure searches in step 12 for the last non-defective block of the flash memory. The Aging Block Table is written in the last-non-defective block of the flash device in step 14 and the procedure finishes and awaits any subsequent formatting commands.

Initially, each age in the Aging Block Table is set to the value "one". Entries related to "bad" blocks have their age set to the value "zero".

At power-on, the Aging Block Table is searched for starting from the last block in the flash memory device.

The Aging Block Table is recognized by reading the spare area of the page. If, e.g., it contains the Aging Block Table flag in the fifth byte, the block contains the Aging Block Table.

For each subsequent format operation as detected in step 10 of FIG. 2, the ABT is not necessarily erased. Instead, the procedure determines in step 16 whether there is enough space to update the ABT in the flash block in which the ABT is stored.

If there is enough free space in the same block to store the Aging Block Table, the Aging Block Table is updated in step 18 by incrementing the ages of the blocks that will be erased in the format operation.

If step 16 determines that no free space is available in the block, the Aging Block Table is loaded in the RAM memory in step 20, the block is completely erased in step 22, the ages for the erased blocks are incremented in step 24, and subsequently, the updated Aging Block Table (with new ages for erased blocks) is written in this block in step 26.

The solution described herein stores information about the free blocks of the flash memory device in a structure called Free Blocks Chain.

The chain has an element for each free block in the flash memory device.

For a given free block each element stores:
the block number,
the age of the block, and
a pointer to the subsequent element in the chain.

The chain is ordered in a FIFO (First In First Out) arrangement. When there is a limit on the dimensions of the RAM memory that can be used, the age of each block can be represented using two bytes. Therefore, up to 65,535 erase operations can be stored in each element.

Since each block can be erased roughly 100,000 times, a technique to overcome this problem is proposed.

Figure 3:
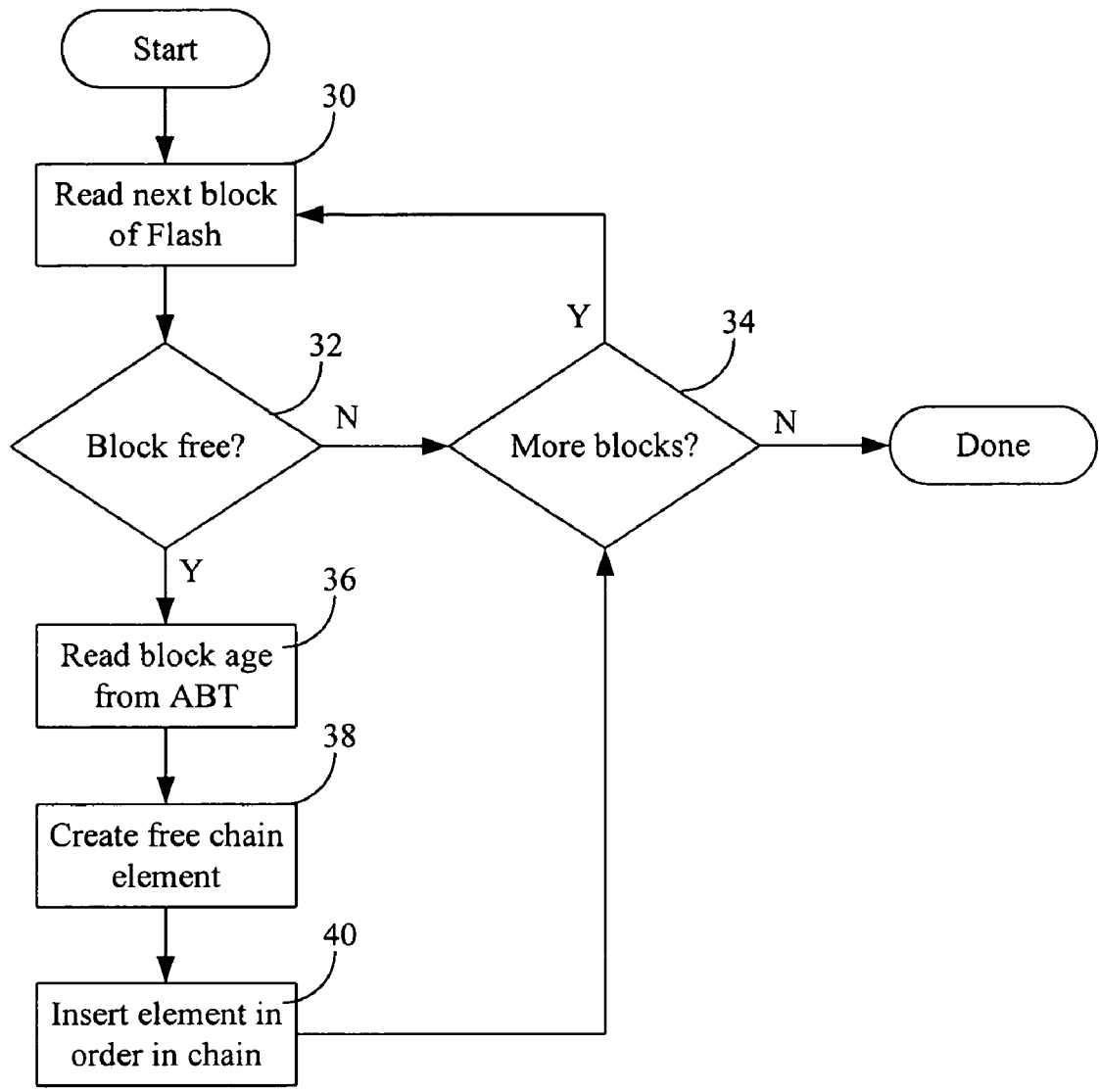
FIG. 3 is a flowchart showing the creation of a free blocks chain used for a method according to one embodiment of the invention.

The Free Block Chain is stored in a portion of the RAM memory and is reconstructed at every device power-on according to a procedure shown in FIG. 3 in one embodiment.

In fact, at power-on, the spare area of the first page of each block in the flash memory device is read in step 30. Every block has the third and fourth byte of the first spare indicating the state of the block (free or allocated), so it is possible to recognize the free blocks via the spare area in step 32.

If step 32 determines that the block is not free, then in step 34 the method determines whether there are more blocks to read. If so, then the method returns to step 30 to read the next block. If not, then the free blocks chain is ready to be used when it is desired to write to a new block as will be discussed in more detail below with respect to FIG. 4.

During the read operation, for each block determined to be free in step 32:
the age is read from the Aging Block Table stored in the flash memory device in step 36;
an element of the Free Blocks Chain is created with the block number and the age previously read in step 38; and
the element created is inserted in the right order in the Free Block Chain in step 40.

The method then returns to step 34 to see if there are more blocks to read and the process is repeated as discussed above.

Figure 4:
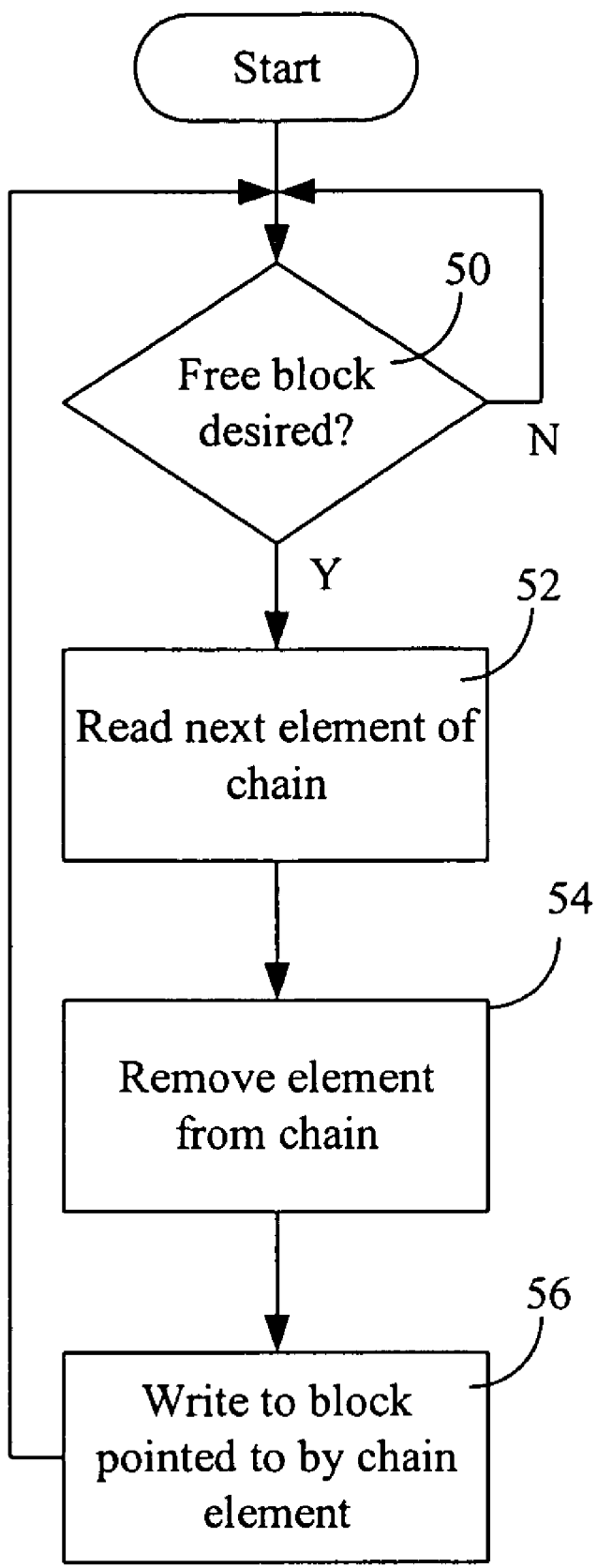
FIG. 4 is a flowchart showing a write procedure according to one embodiment of the invention.

Shown in FIG. 4 is a procedure for writing to a free block of the flash memory. In step 50, the procedure determines whether a free block is desired for writing. If not, then the procedure simply waits in step 50.

When step 50 determines that a free block is to be written, the technique reads the first element in the chain in step 52 and removes it from the list in step 54.

The block with the block number indicated in the selected element is written to in step 56 and the procedure returns to step 50 to await the need for a new free block.

Figure 5:
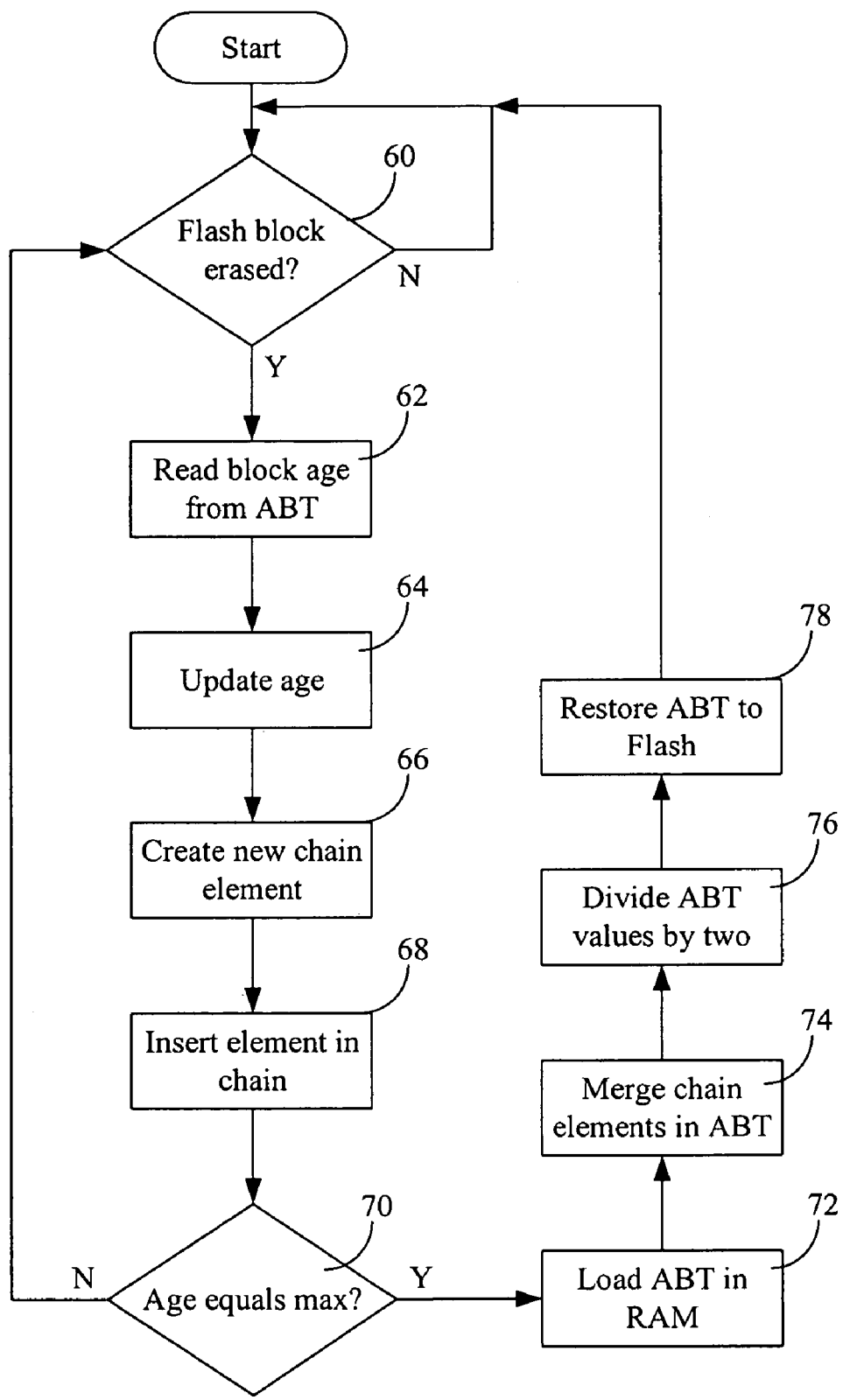
FIG. 5 is a flowchart showing a procedure for updating an ABT and the free blocks chain in response to the erasure of a block of the flash memory, according to one embodiment of the invention.

Shown in FIG. 5 is a procedure for controlling the erasing of blocks of the flash memory. The procedure detects in step 60 when a block is erased and becomes free, reads the age of the block being erased from the Aging Block Table stored in the flash memory device (step 62), increments the age in step 64, and a new Free Blocks Chain element is created in step 66, with the age set to the age read, incremented by one unit. The element created is subsequently inserted in the Free Block Chain in the right order in step 68.

As explained previously in the case of a RAM memory limitation of two bytes per element of the chain, a maximum of, e.g., 65,535 erase operations can be stored in each element of chain.

The procedure checks in step 70 whether the age of a block reaches the maximum storable value (65,535 in the exampled). If the maximum has not been reached, then the procedure simply returns to step 60 to await the erasure of another block of the flash memory. If step 70 determines that the maximum has been reached, then the following steps are executed:

the Aging Block Table stored in the flash memory device is loaded in the RAM memory in step 72;

the information items stored in the Free Block Chain are merged in the Aging Block Table stored in the RAM memory in step 74;

all the values of the Aging Block Table stored in the RAM memory are divided by two in step 76; and the Aging Block Table is rewritten in the flash memory device in step 78, and subsequently the RAM memory is cleared. The procedure returns to step 60 to await the erasure of another block of the flash memory.

After a set of erase operations performed on different blocks (e.g. after a "garbage collection" process) it is possible to merge the information stored in the Free Blocks Chain in the Aging Block Table stored in the RAM memory, thus updating the Aging Block Table.

Figure 6:
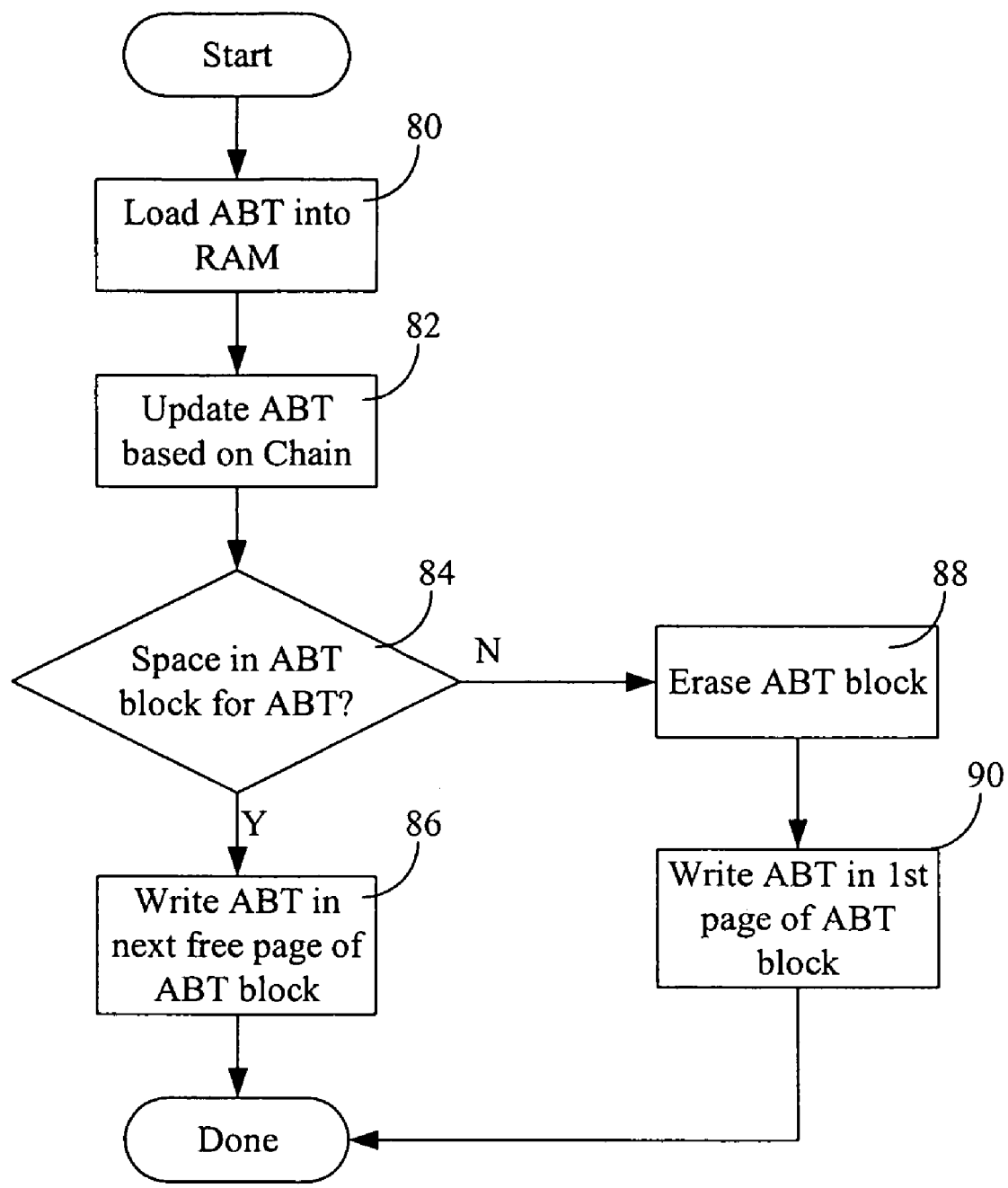
FIG. 6 is a flowchart showing a procedure for updating the ABT based on the free blocks chain.

For this purpose the wear levelling technique operates in this manner as shown in FIG. 6:

it loads in the RAM memory the Aging Block Table stored in the flash memory device (step 80), it updates in the RAM memory the entries related to the free blocks present in the Free Block Chain elements (step 82), and determines if the block containing the Aging Block Table has sufficient free pages to write the table from the RAM memory back to that block (step 84). If so, then it writes the table in the flash memory device starting from the first free page in step 86. If not, it erases the block in step 88 and writes the ABT table from the RAM memory to the ABT block in step 90, starting from the first page.

In that way, the Aging Block Table maintains the right values for the ages of each block.

Figure 7:
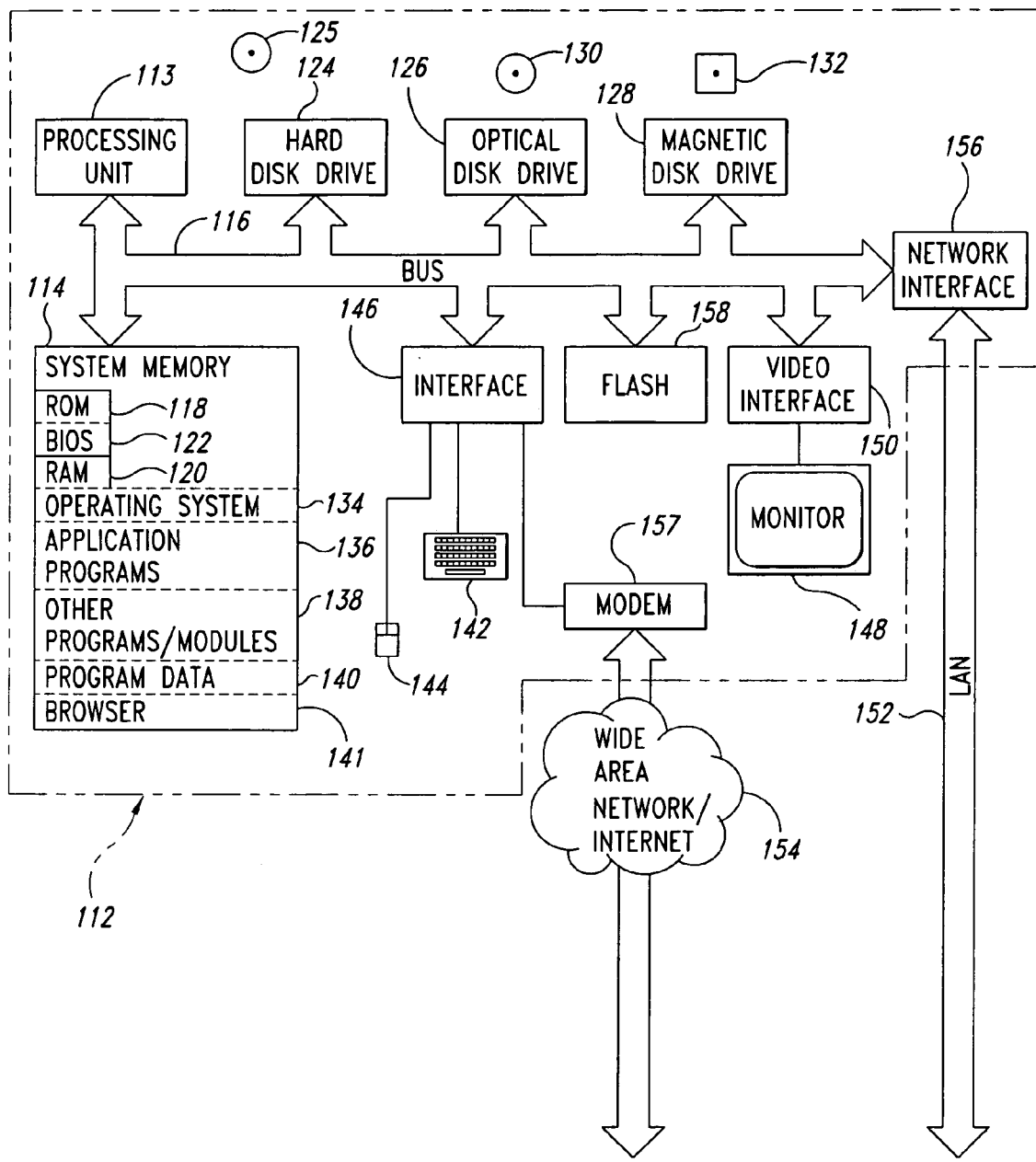
FIG. 7 is a block diagram of a computer system for implementing one embodiment of the present invention.

Those skilled in the art will recognize that the method described above may be implemented in a general purpose computer system. FIG. 7 and the following discussion provide a brief, general description of a suitable computing environment in which the invention may be implemented. Although not required, at least one embodiment of the invention can be implemented in the general context of computer-executable instructions, such as program application modules, objects, or macros being executed by a personal computer. Those skilled in the relevant art will appreciate that the invention can be practiced with other computing system configurations, including handheld devices, multiprocessor systems, microprocessor-based or programmable consumer electronics, network PCs, minicomputers, mainframe computers, and the like. The invention can be practiced in distributed computing environments where tasks or modules are performed by remote processing devices, which are linked through a communications network. In a distributed computing environment, program modules may be located in both local and remote memory storage devices.

Referring to FIG. 7, a personal computer referred to herein as a computing system 112 includes a processing unit 113, a system memory 114 and a system bus 116 that couples various system components including the system memory 114 to the processing unit 113. The processing unit 113 may be any logical processing unit, such as one or more central processing units (CPUs), digital signal processors (DSPs), application-specific integrated circuits (ASIC), etc. Unless described otherwise, the construction and operation of the various blocks shown in FIG. 7 are of conventional design. As a result, such blocks need not be described in further detail herein, as they will be understood by those skilled in the relevant art.

The system bus 116 can employ any known bus structures or architectures, including a memory bus with memory controller, a peripheral bus, and/or a local bus. The system memory 114 includes read-only memory ("ROM") 118 and random access memory ("RAM") 120. A basic input/output system ("BIOS") 122, which can form part of the ROM 118, contains basic routines that help transfer information between elements within the computing system 112, such as during startup.

The computing system 112 also includes one or more spinning media memories such as a hard disk drive 124 for reading from and writing to a hard disk 125, and an optical disk drive 126 and a magnetic disk drive 128 for reading from and writing to removable optical disks 130 and magnetic disks 132, respectively. The optical disk 130 can be a CD-ROM, while the magnetic disk 132 can be a magnetic floppy disk or diskette. The hard disk drive 124, optical disk drive 126 and magnetic disk drive 128 communicate with the processing unit 113 via the bus 116. The hard disk drive 124, optical disk drive 126 and magnetic disk drive 128 may include interfaces or controllers coupled between such drives and the bus 116, as is known by those skilled in the relevant art, for example via an IDE (i.e., Integrated Drive Electronics) interface. The drives 124, 126 and 128, and their associated computer-readable media, provide nonvolatile storage of computer-readable instructions, data structures, program modules and other data for the computing system 112. Although the depicted computing system 112 employs hard disk 125, optical disk 130 and magnetic disk 132, those skilled in the relevant art will appreciate that other types of spinning media memory computer-readable media may be employed, such as, digital video disks ("DVD"), Bernoulli cartridges, etc.

Program modules can be stored in the system memory 114, such as an operating system 134, one or more application programs 136, other programs or modules 138, and program data 140. The system memory 14 also includes a browser 141 for permitting the computing system 112 to access and exchange data with sources such as websites of the Internet, corporate intranets, or other networks, as well as other server applications on server computers. The browser 141 is markup language based, such as hypertext markup language ("HTML"), and operate with markup languages that use syntactically delimited characters added to the data of a document to represent the structure of the document.

While shown in FIG. 7 as being stored in the system memory, the operating system 134, application programs 136, other program modules 138, program data 140 and browser 141 can be stored on the hard disk 125 of the hard disk drive 24, the optical disk 130 and the optical disk drive 126 and/or the magnetic disk 132 of the magnetic disk drive 128. A user can enter commands and information to the computing system 112 through input devices such as a keyboard 142 and a pointing device such as a mouse 144. Other input devices can include a microphone, joystick, game pad, scanner, etc. These and other input devices are connected to the processing unit 113 through an interface 146 such as a serial port interface that couples to the bus 116, although other interfaces such as a parallel port, a game port or a universal serial bus ("USB") can be used. A monitor 148 or other display devices may be coupled to the bus 116 via video interface 150, such as a video adapter. The computing system 112 can include other output devices such as speakers, printers, etc.

The computing system 112 can operate in a networked environment using logical connections to one or more remote computers. The computing system 112 may employ any known means of communications, such as through a local area network ("LAN") 152 or a wide area network ("WAN") or the Internet 154. Such networking environments are well known in enterprise-wide computer networks, intranets, and the Internet.

When used in a LAN networking environment, the computing system 112 is connected to the LAN 152 through an adapter or network interface 156 (communicatively linked to the bus 116). When used in a WAN networking environment, the computing system 112 often includes a modem 157 or other device for establishing communications over the WAN/Internet 154. The modem 157 is shown in FIG. 7 as communicatively linked between the interface 146 and the WAN/Internet 154. In a networked environment, program modules, application programs, or data, or portions thereof, can be stored in a server computer (not shown). Those skilled in the relevant art will readily recognize that the network connections shown in FIG. 7 are only some examples of establishing communication links between computers, and other links may be used, including wireless links.

The computing system 112 may include one or more interfaces to allow the addition of devices either internally or externally to the computing system 112. For example, suitable interfaces may include ISA (i.e., Industry Standard Architecture), IDE, PCI (i.e., Personal Computer Interface) and/or AGP (i.e., Advance Graphics Processor) slot connectors for option cards, serial and/or parallel ports, USB ports (i.e., Universal Serial Bus), audio input/output (i.e., I/O) and MIDI/joystick connectors, and/or slots for memory.

The term "computer-readable medium" as used herein refers to any medium that participates in providing instructions to processing unit 113 for execution. Such a medium may take many forms, including but not limited to, non-volatile media, volatile media, and transmission media. Non-volatile media includes, for example, hard, optical or magnetic disks 125, 130, 132, respectively. Volatile media includes dynamic memory, such as system memory 114. Transmission media includes coaxial cables, copper wire and fiber optics, including the wires that comprise system bus 116. Transmission media can also take the form of acoustic or light waves, such as those generated during radio wave and infrared data communications.

Common forms of computer-readable media include, for example, a floppy disk, a flexible disk, hard disk, magnetic tape, or any other magnetic medium, a CD-ROM, any other optical medium, punch cards, paper tape, any other physical medium with patterns of holes, a RAM, a PROM, and EPROM, a FLASH-EPROM, any other memory chip or cartridge, a carrier wave as described hereinafter, or any other medium from which a computer can read.

Various forms of computer readable media may be involved in carrying one or more sequences of one or more instructions to processing unit 113 for execution. For example, the instructions may initially be carried on a magnetic disk of a remote computer. The remote computer can load the instructions into its dynamic memory and send the instructions over a telephone line using a modem. The modem 157 local to computer system 112 can receive the data on the telephone line and use an infrared transmitter to convert the data to an infrared signal. An infrared detector coupled to the system bus 116 can receive the data carried in the infrared signal and place the data on system bus 116. The system bus 116 carries the data to system memory 114, from which processing unit 113 retrieves and executes the instructions. The instructions received by system memory 114 may optionally be stored on storage device either before or after execution by processing unit 113.

Specific to one embodiment of the present invention, the computing system also includes a flash memory 158 that includes the ABT and is controlled according to the method discussed above with respect to FIGS. 2-6. The instructions for implementing the method can also be stored in the flash memory 158. The method could be implemented using the main processing unit 113 or a separate processor/controller that could be incorporated within the flash memory device or added to the computer system 112 and coupled to the bus 116.

Consequently, without prejudice to the underlying principles of the invention, the details and the embodiments may vary, also appreciably, with reference to what has been described by way of example only, without departing from the scope of the invention as defined by the annexed claims.

What is claimed is:

1. A method of controlling write/erase operations in a memory device including memory blocks, said blocks being exposed to wear as a result of repeated erasures, the method comprising:
   arranging the blocks in the memory device in orderly logical positions;
   storing erase counts associated with the memory blocks in a table, entering as an i-th entry in the table a number of erasures performed on a block in an i-th position in the memory device;
   creating a chain storing block numbers and corresponding erase counts for memory blocks that are available for writing at a certain instant of time;
   selecting for writing, out of the blocks of said memory device available for writing, the block having the lowest erase count in said chain; and
   writing data in said block having the lowest erase count in said chain.

2. The method of claim 1, including the step of:
   updating the chain.

3. The method of claim 1, including the steps of associating said memory device with a RAM memory and creating said chain in a portion of said RAM memory.

4. The method of claim 1, wherein each block is partitioned into a main area and a spare area, and the table is located in the main area of one of said blocks.

5. The method of claim 4, including the steps of providing pages for storing table entries of said table, wherein said pages contain a flag in said spare area of the one of said blocks.

6. The method of claim 1, further comprising providing pages for storing table entries of said table, wherein said pages contain a flag indicating that the pages store said table entries.

7. The method of claim 6, including the step of searching for said table within said memory device during power-on operation by recognizing the pages storing said table entries based on said flag.

8. The method of claim 7, including the step of searching said table within said memory device starting from the last physical block in said memory device.

9. The method of claim 1, including the steps of:
   selecting a last non-defective physical memory block in said memory device; and writing said table in said non-defective memory block when said memory device is formatted for the first time.

10. The method of claim 9, wherein for each subsequent formatting operation of said memory device said table is updated by incrementing the erase counts of the memory blocks that will be erased.

11. The method of claim 1 wherein creating said chain comprises storing for each said block available for writing:
a block number;
an associated erase count; and
a pointer to a subsequent element in the chain.

12. The method of claim 11, wherein said chain is ordered in a FIFO (First In First Out) way.

13. The method of claim 11, including the step of reconstructing said chain at every device power-on.

14. The method of claim 1, including the steps of:
associating with said memory device a RAM memory;
detecting when the erase count for a given block value reaches a maximum storable value;
loading said erase counts in said RAM memory;
dividing by two said erase counts stored in said RAM memory; and
re-writing said divided erase counts in said memory device.

15. The method of claim 1, including the step of selecting said memory device as a flash memory device.

16. A method of controlling write/erase operations in a memory device including memory blocks, said blocks being exposed to wear as a result of repeated erasures, the method comprising:
storing erase counts of said memory blocks, each erase count reflecting the number of erasures of an associated one of the memory blocks;
creating a chain storing block numbers and corresponding erase counts for memory blocks that are available for writing at a certain instant of time, wherein creating the chain comprises storing for each said block available for writing:
a block number;
an associated erase count; and
a pointer to a subsequent element in the chain;
selecting for writing, out of the blocks of said memory device available for writing, the block having the lowest erase count in said chain; and
writing data in said block having the lowest erase count in said chain, wherein creating said chain comprises performing, for each said block available for writing, the operations of:
reading an associated erase count;
creating a corresponding element for said chain including a block number and said erase count previously read; and
inserting the element thus created in said chain.

17. A computer system, comprising:
a memory device including memory blocks that are exposed to wear as a result of repeated erasures;
storing means for storing erase counts of the memory blocks, each erase count reflecting the number of erasures of an associated one of the memory blocks;
means for creating a chain storing block numbers and corresponding erase counts of the memory blocks that are available for writing at a certain instant of time; and
means for selecting for writing, out of the blocks of the memory device available for writing, the block having the lowest erase count in the chain, wherein the means for creating the chain include means for:
accessing each block of the memory device that is available for writing;
reading from the storing means the erase count associated with the block;
creating a corresponding element for the chain including a block number and the erase count previously read; and
inserting the element thus created in the chain.

18. The system of claim 17, further comprising:
means for removing an element of the chain corresponding to the block having the lowest erase count in the chain after the block is selected for writing.

19. The system of claim 17 wherein the means for storing the erase counts store the erase count of each block in a table in a last non-defective memory block in the memory device.

20. The system of claim 17 wherein the means for creating the chain include means for storing, for each the block available for writing, a chain element that includes:
a block number of the block;
the erase count of the block; and
a pointer to a subsequent element in the chain.

21. The system of claim 17, wherein the chain is ordered in a FIFO (First In First Out) way.

22. The system of claim 17 wherein the means for creating include means for reconstructing the chain at every device power-on.

23. The system of claim 17, further comprising:
a RAM memory;
means for detecting when the erase count for a given block value reaches a maximum storable value;
means for loading the erase counts in the RAM memory;
means for dividing by two the erase counts stored in the RAM memory; and
means for writing the divided erase counts in the memory device.

24. A computer product for controlling write/erase operations in a memory device including memory blocks that are exposed to wear as a result of repeated erasures, the computer product being loadable into a memory of a digital computer and comprising instruction code portions for performing, when the product is run on a computer, the following operations:
storing erase counts of the memory blocks, each erase count reflecting the number of erasures of an associated one of the memory blocks;
creating a chain storing block numbers and corresponding erase counts of the memory blocks that are available for writing at a certain instant of time; and
selecting for writing, out of the blocks of the memory device available for writing, the block having the lowest erase count in the chain, wherein creating the chain comprising performing, for each the block available for writing, the operations of:
reading an associated erase count;
creating a corresponding element for the chain including a block number and the erase count previously read; and
inserting the element thus created in the chain.

25. The computer product of claim 24, further including instruction code portions for performing, when the product is run on a computer, the following operations:
writing data in the block having the lowest erase count in the chain; and
updating the chain.

26. The computer product of claim 24, further including instruction code portions for performing, when the product is run on a computer, the following operations:
  storing the erase count of each block in a table in a selected block of the memory device;
  storing in the selected block a flag indicating that the table is stored in the selected block.

27. The computer product of claim 24, further including instruction code portions for performing, when the product is run on a computer, the following operation:
  creating the chain by storing, for each the block available for writing: a block number, an associated erase count, and a pointer to a subsequent element in the chain.

28. The computer product of claim 24, further including instruction code portions for performing, when the product is run on a computer, the following operations:
  associating with the memory device a RAM memory;
  detecting when the erase count for a given block value reaches a maximum storable value;
  loading the erase counts in the RAM memory;
  dividing by two the erase counts stored in the RAM memory; and
  re-writing the divided erase counts in the memory device.

29. A system comprising:
  a plurality of memory blocks arranged in orderly logical positions and that are exposed to wear as a result of repeated erasures; and
  a processing unit configured to:
    store erase counts for the memory blocks in the plurality of memory blocks in a table, entering an erase count for a respective block in a corresponding position in the table;
    create a chain storing block numbers and corresponding erase counts for memory blocks in the plurality of memory blocks that are available for writing; and
    select a memory block in the chain having a lowest erase count.

30. The system of claim 29 wherein the processing unit is further configured to selectively update the chain.

31. The system of claim 29, further comprising a RAM memory wherein the processing unit is configured to store the chain in the RAM memory.

* * * * *